US008995130B2

(12) United States Patent
Hosoda

(10) Patent No.: US 8,995,130 B2
(45) Date of Patent: Mar. 31, 2015

(54) POWER SUPPLY UNIT USING HOUSING IN WHICH PRINTED CIRCUIT BOARD IS HOUSED

(75) Inventor: Tsuyoshi Hosoda, Okazaki (JP)

(73) Assignee: Denso Corporation, Kariya (JP)

( * ) Notice: Subject to any disclaimer, the term of this patent is extended or adjusted under 35 U.S.C. 154(b) by 271 days.

(21) Appl. No.: 13/564,067

(22) Filed: Aug. 1, 2012

(65) Prior Publication Data

US 2013/0033818 A1    Feb. 7, 2013

(30) Foreign Application Priority Data

Aug. 1, 2011    (JP) .................................. 2011-167966

(51) Int. Cl.
*H05K 7/20* (2006.01)
*H01L 23/473* (2006.01)

(52) U.S. Cl.
CPC ................................. *H05K 7/20927* (2013.01)
USPC ............ 361/702; 361/704; 361/719; 165/185

(58) Field of Classification Search
USPC .................. 361/699, 702, 704, 719; 165/185
See application file for complete search history.

(56) References Cited

U.S. PATENT DOCUMENTS

| | | | |
|---|---|---|---|
| 7,167,366 B2 * | 1/2007 | Cheon | 361/699 |
| 8,243,451 B2 * | 8/2012 | Dede et al. | 361/702 |
| 8,817,468 B2 * | 8/2014 | Hirashima | 361/689 |
| 2004/0190318 A1 | 9/2004 | Tsuchiya et al. | |

FOREIGN PATENT DOCUMENTS

| | | | | |
|---|---|---|---|---|
| DE | 102007014713 | * | 9/2008 | .............. H05K 7/20 |
| JP | 08-331835 | | 12/1996 | |
| JP | 11-121690 | | 4/1999 | |
| JP | 2000-184752 | | 6/2000 | |
| JP | P2002-345245 | A | 11/2002 | |
| JP | P2004-345245 | A | 11/2002 | |
| JP | 2003-153552 | | 5/2003 | |
| JP | P2004-297887 | A | 10/2004 | |
| JP | 2008-061372 | | 3/2008 | |
| JP | 2008-199889 | | 8/2008 | |
| JP | 2009-238785 | | 10/2009 | |
| JP | 2011233726 | A | * 11/2011 | ............ H01L 23/473 |

OTHER PUBLICATIONS

Office Action (2 pages) dated Jun. 20, 2013, issued in corresponding Japanese Application No. 2011-167966 and English translation (2 pages).
Office Action (2 pages) dated Feb. 6, 2014, issued in corresponding Japanese Application No. 2011-167966 and English translation (3 pages).

* cited by examiner

*Primary Examiner* — Robert J Hoffberg
(74) *Attorney, Agent, or Firm* — Nixon & Vanderhye PC

(57) ABSTRACT

In a power supply unit, a printed circuit board is provided on which two or more different-shape components are mounted. Such components include semiconductor devices. The printed circuit board has a designated mounting surface of the board. The housing is also provided, which houses the printed circuit board and comprises a cooling member for cooling a first space formed between the mounting surface and an opposed surface in the housing. The opposed surface is opposed to the mounting surface. The cooling member is arranged at part of the opposed surface, the part of the opposed surface projects toward the semiconductor devices, and the opposed surface is opposed to the two or more types of different-shape components.

15 Claims, 8 Drawing Sheets

POWER SUPPLY UNIT USING HOUSING IN WHICH PRINTED CIRCUIT BOARD IS HOUSED

CROSS-REFERENCE TO RELATED APPLICATION

This application is based on and claims the benefit of priority from earlier Japanese Patent Application No. 2011-167966 filed Aug. 1, 2011, the description of which is incorporated herein by reference.

BACKGROUND

1. Technical Field

The present invention relates to a power supply unit using a printed circuit board accommodated in a housing which is provided with a cooling member.

2. Related Art

Switching power supply units are well known. For example, JP-A-2002-345245 discloses an example of a technique related to a switching power supply unit. This switching power supply unit is able to increase packaging density of components, easily reduce size, reduce resistance loss at terminal connecting portions and enhance power supply efficiency. Also, in this switching power supply unit, a transformer, lead portions, electrode members and the like are fixed to one designated surface of a given circuit board. The lead portions, which correspond to portions of extended flat metal windings, have ends connected to the electrode members.

Further, for example, JP-A-2004-297887 discloses an example of a technique related to a water-cooled switching power supply with a reduced size. This switching power supply includes a base plate on which a switching circuit, main transformer, rectifier circuit and smoothing circuit are mounted. The base plate is also provided thereon with a seat member, in which a coolant passage is formed to cool electronic components. A control circuit board for controlling the switching circuit is arranged above the base plate (see JP-A-2004-297887). Although not shown in JP-A-2004-297887, the switching power supply also includes circuit elements for controlling the switching circuit. The circuit elements have no other alternative but to be mounted on the upper surface of the control circuit board. This is because the upper surface of the base plate (i.e. beneath the control circuit board) is used for mounting the switching circuit, the main transformer and the like.

Accordingly, it is difficult to ensure a space for mounting the circuit elements for the control circuit board on the upper surface of the base plate. In the event the circuit elements are mounted on the upper surface of the base plate, the circuit elements are limited to those which have a small height when mounted.

Combination of the techniques disclosed in JP-A-2002-345245 and JP-A-2004-297887 can provide the following technique. In the technique disclosed in JP-A-2002-345245, the lead portions and the elements or parts, such as the electrode members, are arranged on one designated surface. On the other hand, in the technique disclosed in JP-A-2004-297887, the switching elements are required to be cooled by the seat member formed on the base plate. Therefore, the switching elements are inevitably arranged on the other side of the circuit board (the side opposite to the surface on which the elements or parts are arranged). An example of this arrangement is illustrated in FIG. 1.

As shown in FIG. 1, different-shape components (Pa, Pb, Pc, Pd, Pe, etc.), such as circuit elements or parts, are mounted on a circuit board (BP). In the figure, the dimension of the components in a height direction is indicated by Hb relative to the mounting surface of the circuit board (hereinafter referred to as a mounted height). When the entirety, including the different-shape components, the switching circuit and the like on the base plate, the cooling member, and the like, is to be accommodated in a housing, the housing is required to ensure a space (height) larger than a height Ha (Ha>Hb), leading to the necessity of increasing the size. On the other hand, a gap formed between the circuit board and the base plate and having a height He may allow arrangement such as of the circuit elements or parts.

However, an attempt of reducing the size of the housing raises a problem that the circuit elements or parts arranged in the gap are limited to those which have a small mounted height. On the other hand, arranging the circuit elements or parts having a large mounted height in the gap raises a problem of easily producing a dead space because not all the circuit elements or parts have an even mounted height.

SUMMARY

Hence it is desired to provide a power supply unit having a small-sized housing and a more reduced dead space than a power supply unit of conventional art.

An exemplary embodiment provides a power supply unit comprising: a printed circuit board on which two or more different-shape components having different heights when being mounted on the printed circuit board, wherein the different-shape components including at least semiconductor devices, the different-shape components are either different-shape components having a predetermined height or more when being mounted on the printed circuit board or two or more types of different-shape components, the printed circuit board has two or more mounting surfaces including one designated mounting surface, and the semiconductor devices and the different-shape components are mounted on the designated mounting surface; and a housing that houses the printed circuit board and comprises a cooling member for cooling a first space formed in the housing between the mounting surface of the printed circuit board and an opposed surface of the housing, wherein the opposed surface is opposed to the designated mounting surface, the cooling member is arranged at part of the opposed surface, the part of the opposed surface projects toward the semiconductor devices, and the opposed surface is opposed to the two or more types of different-shape components.

With this configuration, the semiconductor elements and the different-shape components are arranged on the mounting surface that is the one designated surface of the circuit board. While being mounted on the mounting surface, the different-shape components are located (in a first space) between the mounting surface and the opposed surface of the housing. The different-shape components mounted on the designated surface of the mounting surface of the circuit board and accommodated in the housing may have a height equal to or larger than a predetermined height. Also, two types or more of different-shape components may be mounted on the designated surface of the mounting surface of the circuit board for accommodation in the housing. In such a case, the different-shape components are located (in the first space, or within the height in particular of the first space) between the mounting surface and the opposed surface. Thus, no elements or parts having a large height are arranged on the surface opposite to the designated surface of the mounting surface. As a result, the size of the housing is reduced, while a dead space is also reduced compared to a configuration of conventional art. Further, in spite of the reduction in the size of the housing, the cooling member formed in a part of the opposed surface of the housing is able to cool at least the semiconductor elements in a direct or indirect manner.

The semiconductor elements include any elements if the elements form a functionally essential part, i.e. a basis of a semiconductor electronic part or a basis of an electronic part. For example, the semiconductor elements may include switching elements (e.g., FETs, IGBTs, GTOs and power transistors), rectifier elements (e.g., rectifier circuits and commutators), and ICs (e.g., LSIs, VLSIs and ASICs).

On the designated surface, on-board components such as elements and parts are arranged. For simplification, the designated surface is hereinafter referred to as a front mounting surface. In contrast to this term, the surface opposite to the front mounting surface of the circuit board is hereinafter referred to as a rear mounting surface. The on-board components may be mounted or may not be mounted on the rear mounting surface.

The on-board components refer to those components which can be mounted on a circuit board, such as elements (e.g., semiconductor elements and circuit elements) and parts (e.g., connecting wires, seats and terminal blocks). The on-board components may be mounted on the front mounting surface or the rear mounting surface.

The predetermined height may be optionally determined. For example, the predetermined height may be 3 mm or 10 mm. However, when the on-board components are arranged on the rear mounting surface as well, the predetermined height is set to a value, such as 5 mm or 8 mm, which is equal to or larger than the height of the on-board component having the largest height among the on-board components arranged on the rear mounting surface.

The different-shape components refer to those components which have a different shape (height, in particular) among the on-board components.

The circuit board may be a single-layer circuit board or a multilayer circuit board, if only the circuit board is a plate-like member that can mount the semiconductor elements and the different-shape components.

Any device or part can serve as the cooling member if only the device or part is able to cool the on-board components. For example, one type or more selected from a portion, part or device that has a passage through which a coolant (a fluid, such as air, water and oil) flows, cooling fins (radiation fins), a heat pump, and the like, may correspond to the cooling member.

The housing may be any housing if only the housing is able to accommodate the circuit board, the cooling member and the like. For example, a unit of housing may be used. Alternatively, a housing having a single space may be used, to cover a block member in which a plurality of spaces are defined by partition members (e.g., partition walls or partition boards).

In a preferred embodiment, the cooling member is able to directly or indirectly cool not only the semiconductor elements but also the different-shape components whose temperature may increase to a predetermined temperature or more. The predetermined temperature may be optionally determined. However, desirably, the predetermined temperature may be set to a heat-resistant temperature (e.g., 85° C. or 105° C.) of a different-shape component. Further, the different-shape components arranged near the cooling member can be cooled by the cooling air.

The situation where the temperature of a different-shape component may increase to a predetermined temperature or more corresponds, for example, to: a situation where the temperature of the component is increased by the heat which is generated with the flow of electrical current; or a situation where the temperature of the component is increased by being influenced by the peripheral conditions or by peripheral parts or the like which generate heat.

The indirect contact refers to a state where another member (e.g., an insulating sheet) is interposed between the cooling member and a different-shape component.

In another preferred embodiment, the cooling air produced by the coolant in the cooling member can cool the different-shape components via the housing (the portion corresponding to the opposed surface) and the projection, using the principle of thermal conduction, the different-shape components being in contact with or non-contact with (or close to) the projection.

The projection may have any shape. For example, the projection may have a shape of a seat or may have a cylindrical shape that can partially or entirely enclose the different-shape components.

In another preferred embodiment, the insert bus bar is able to play a role of establishing electrical connection. The insert bus bar is arranged being partially or entirely inserted between (into a dead space in particular between) the front mounting surface and the opposed surface. Accordingly, provision of the insert bus bar does not give any difference to the height of the housing. Thus, the size of the housing is reduced and at the same time the dead space is reduced compared to a configuration of conventional art).

In another preferred embodiment, a connection distance is shortened between the terminal section of the insert bus bar and the circuit elements. Thus, the size of the housing is reduced. In addition, this configuration can minimize the adverse effects of connecting wires (e.g., noise due to electrical resistance and occurrence of electrical field).

The circuit components and the circuit elements, recited in the above preferred embodiment, have a similar meaning in a sense that both of them are used for an electrical circuit. These terms are used for distinguishing the objects of electrical connection established by the insert bus bar from the objects arranged in the second space. Some circuit elements may be included in the circuit components, while some circuit components may be included in the circuit elements.

Further, preferably, the cooling member is formed along one short side of the housing, including the corners sandwiching the short side. This location of the cooling member increases the degree of freedom in the design, height and density of the on-board components arranged on the front mounting surface of the circuit board, compared to the case where the cooling member is formed at a position other than the position along one short side of the housing (e.g., the center of the housing).

DETAILED DESCRIPTION OF THE PREFERRED EMBODIMENTS

Figure 1:
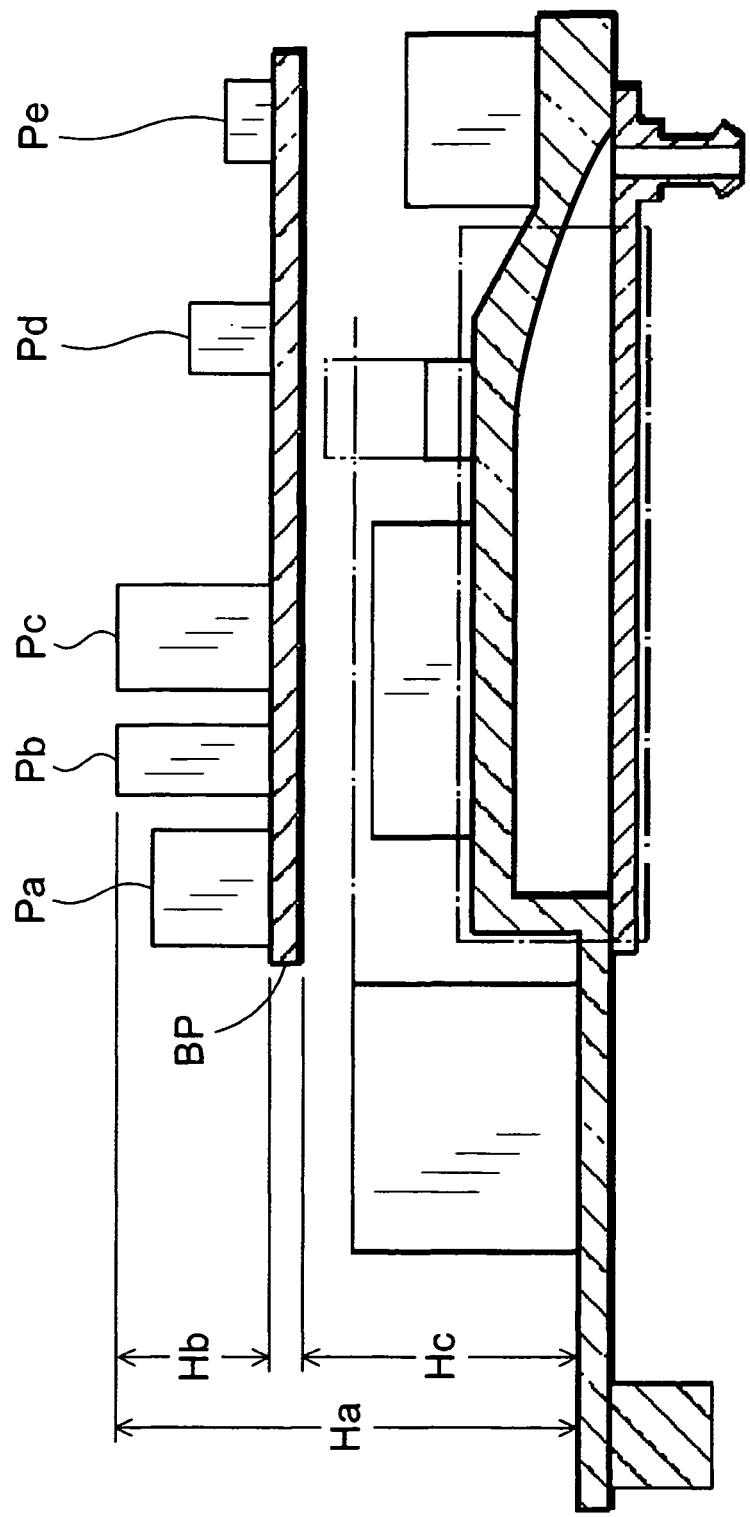
FIG. 1 is a cross-sectional view illustrating a configuration according to conventional art.

With reference to the accompanying drawings, hereinafter are described some embodiments of the present invention. It should be appreciated that, unless specifically referred to, a term connection refers to an electrical connection. Each of the figures illustrates elements necessary for describing the present invention and does not illustrate all the actual elements. Directions, such as top and bottom or left and right, are referred to with reference to the illustrations in the drawings. A series of references is indicated using a symbol "–". For example, an expression of connecting terminals T1-T6 refers to connecting terminals T1, T2, T3, T4, T5 and T6.

First Embodiment

Figure 2:
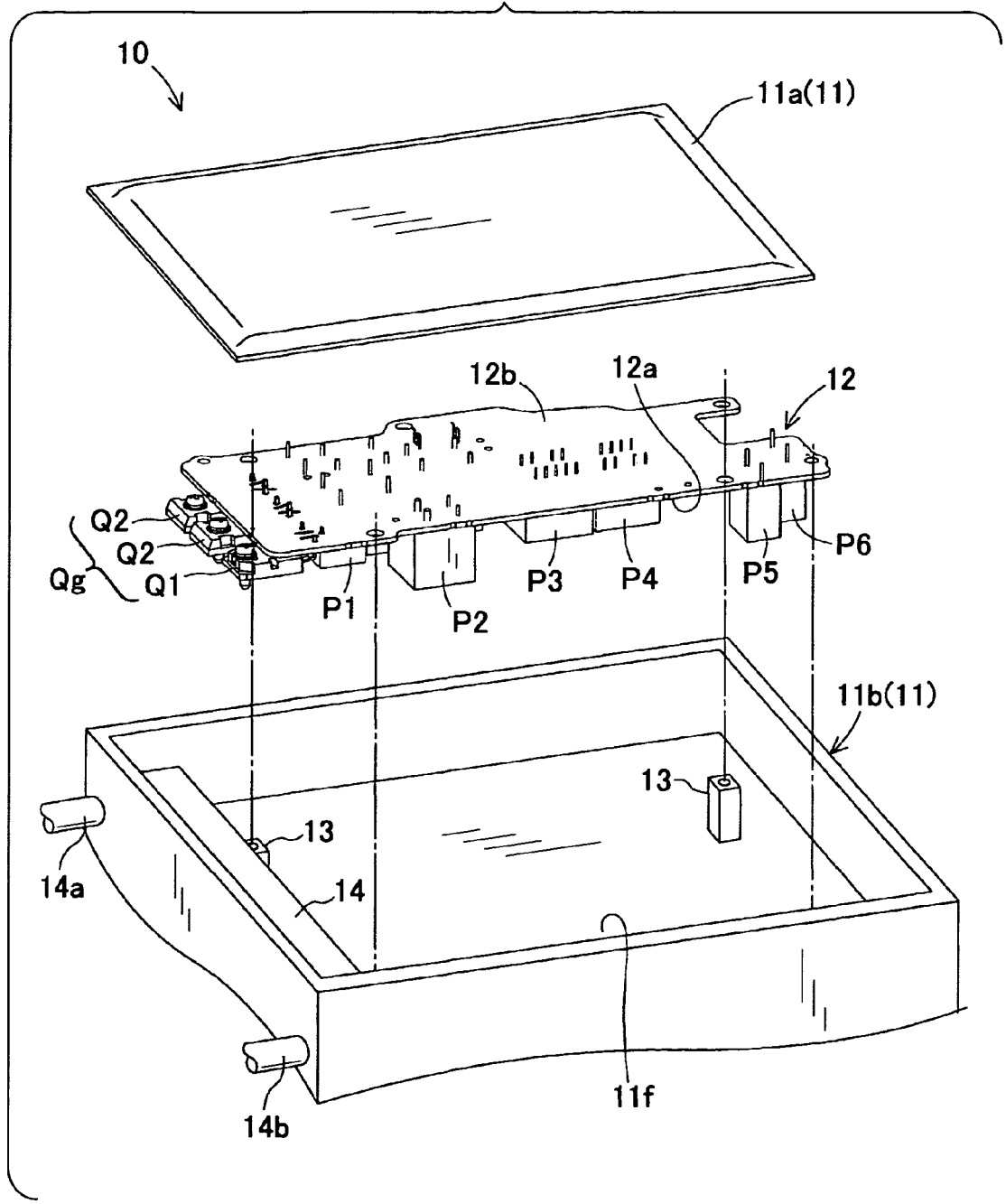
FIG. 2 is an exploded schematic perspective view illustrating a power supply unit according to a first embodiment of the present invention.

Referring to FIGS. 2 to 5, a first embodiment of the present invention is described. FIG. 2 is an exploded schematic perspective view of a power supply unit 10.

The power supply unit 10 shown in FIG. 2 is a so-called DC-DC converter. The power supply unit 10 has a function of converting DC voltage supplied from a power source (e.g., a battery or a fuel cell) into desired voltage and of outputting the converted voltage. The power supply unit 10 includes a housing 11, a printed circuit board 12 and accommodation components, not shown. The term of accommodation components refers to parts and the like accommodated inside the housing 11, i.e. parts and the like that are not arranged on the printed circuit board 12. For example, the accommodation components include circuit elements (e.g., a rectifier circuit, a transformer and a filter circuit), an insert bus bar (see FIG. 7 and FIGS. 8A to 8C) described later, and the like.

The housing 11 is composed of a housing cover 11a and a housing body 11b. The housing body 11b has the shape of a box with one side being open. For simplicity, FIG. 2 shows a parallelepiped housing body 11b. However, the housing body 11b may have any shape if only the printed circuit board 12, the accommodation components and the like can be accommodated. The housing cover 11a covers the opening of the housing body 11b. The housing 11 of the present embodiment is made of metal. Alternative to this, however, the housing 11 may be partially or entirely made of a different material (e.g., resin) that meets the conditions of usage environment (e.g., temperature, magnetic screening and hardness).

The printed circuit board 12 has a front mounting surface 12a and a rear mounting surface 12b, both being applied with printed wiring. On-board components are arranged and mounted on the printed circuit board 12. The on-board components include those components which can be mounted on the circuit board, such as elements (including semiconductors and circuit elements) and parts (including connecting wires, seats and terminal blocks). The on-board components may be mounted on the front mounting surface or may be mounted on the rear mounting surface.

Thus, various types of on-board components having various shapes may be mounted, Hereinafter, those on-board components which have a different height (mounted height) with reference to the front mounting surface 12a are referred to as different-shape components. The front mounting surface 12a as one surface is mounted with different-shape components having a predetermined height or more when mounted, or two or more types of different-shape components, such as elements and parts. On the other hand, the rear mounting surface 12b is applied with only printed wiring, or arranged with only the on-board components having a low mounted height. The predetermined mounted height may be optionally determined. For example, the predetermined mounted height may be equal to or larger than the largest mounted height (e.g., 5 mm or 8 mm) of an on-board component when mounted, among the on-board components mounted on the rear mounting surface 12b.

FIG. 2 shows a semiconductor elements group Qg and different-shape components P1-P6 mounted on the front mounting surface 12a. The semiconductor elements group Qg is also included in the different-shape components. Specifically, in FIG. 2, one semiconductor element Q1 and two semiconductor elements Q2 (hereinafter just referred to as semiconductor elements Q1 and Q2) are different-shape components. The semiconductor elements Q1 and Q2 may be such switching elements as FETs (e.g., MOSFETs, JFETs, MESFETs), IGBTs, GTOs or power transistors. Although not shown, the two semiconductors Q2 are connected in parallel, to which the semiconductor Q1 is connected in series.

As shown in FIG. 2, the housing 11 has an interior (the interior of the housing body 11b in particular) in which a plurality of seats 13 and a cooling member (or cooling section) 14 are provided. The housing body 11b has a bottom providing an opposed surface described later. Either or both of the seats 13 and the cooling member 14 may be integrally formed with the housing body 11b, or may be separately formed and then fixed to the housing body 11b using a fixing means (e.g., screwing or adhesion using an adhesive or the like). The plurality of seats 13 are used for fixing the printed circuit board 12 to the housing body 11b, in accommodating the printed circuit board 12 in the housing 11.

The cooling member 14 has a function of cooling the semiconductor elements group Qg, the different-shape components, accommodation components, and the like. The cooling member 14 of the present embodiment has an interior in which a coolant passage 14c is formed (see FIG. 5) to pass a coolant (e.g., water, air or oil) therethrough. The cooling member 14 has pipe connectors 14a and 14b that serve as inlets/outlets for allowing the coolant to flow therethrough. The pipe connectors 14a and 14b are configured to be connected to piping (e.g., pipes, tubes and hoses) to allow the coolant to flow from the cooling member 14 to a cooling device (e.g., radiator), not shown, or vice versa. In order to reliably perform cooling in this way via the coolant, the cooling member 14 may desirably be formed of a material having high heat conductivity (e.g., metal, such as aluminum or copper, or carbon nanotube).

Figure 3:
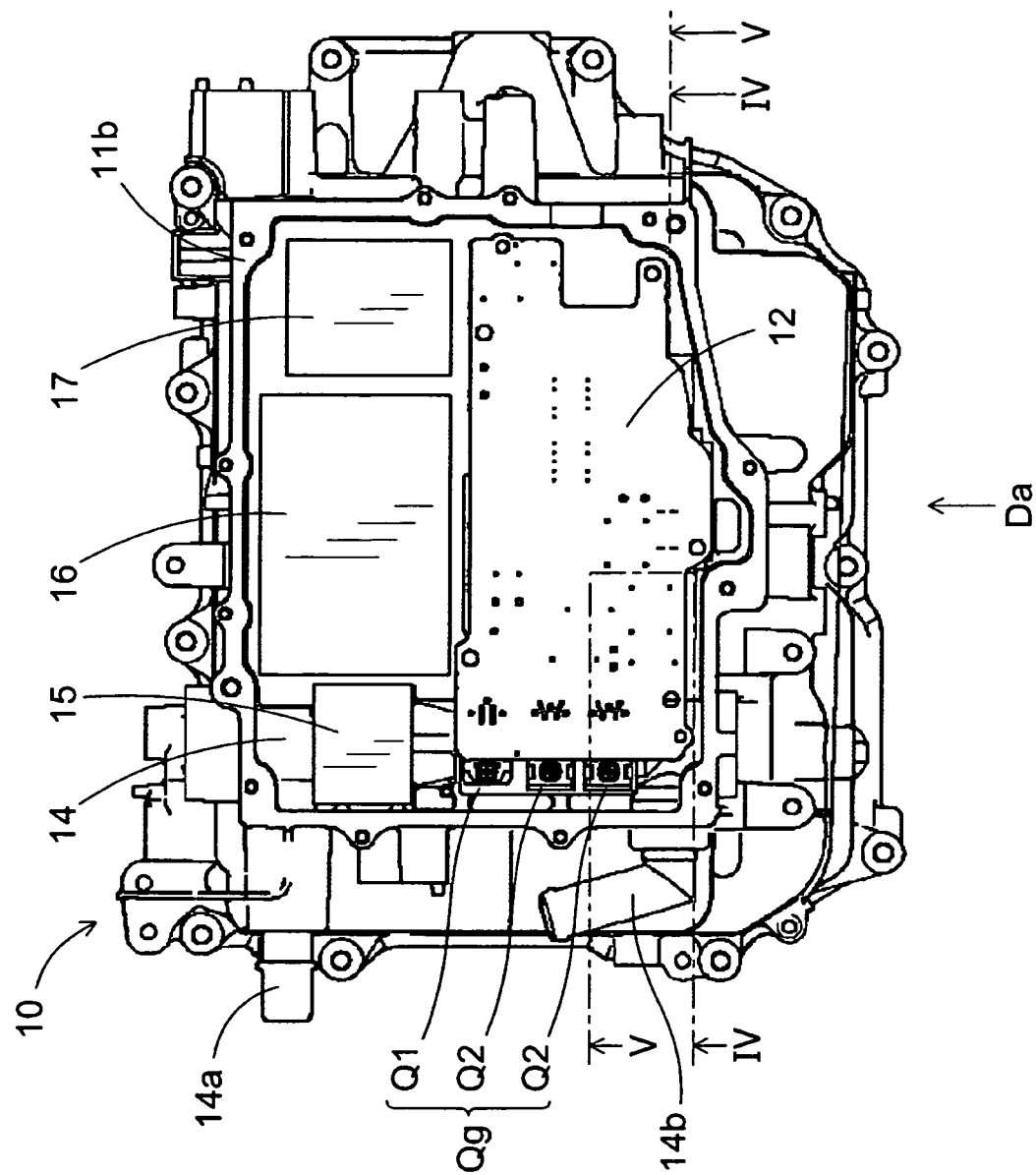
FIG. 3 is a schematic plan view illustrating the power supply unit.
Figure 4:
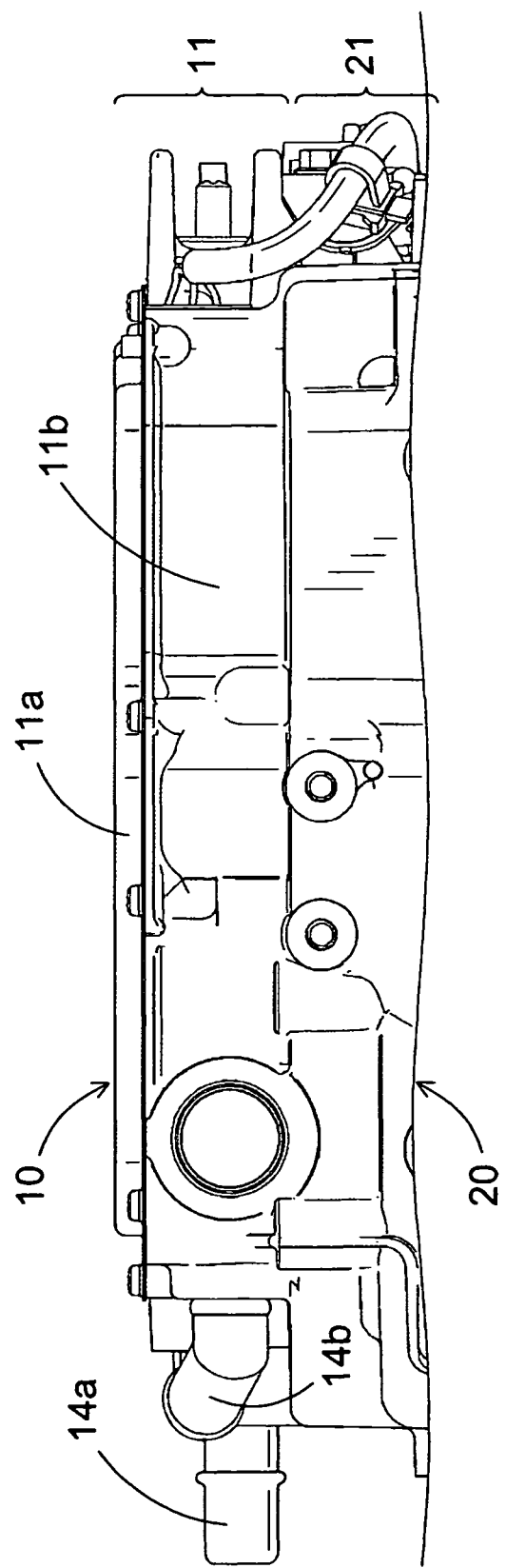
FIG. 4 is a side view illustrating the power supply unit as viewed from a direction of an arrow Da indicated in FIG. 3.
Figure 5:
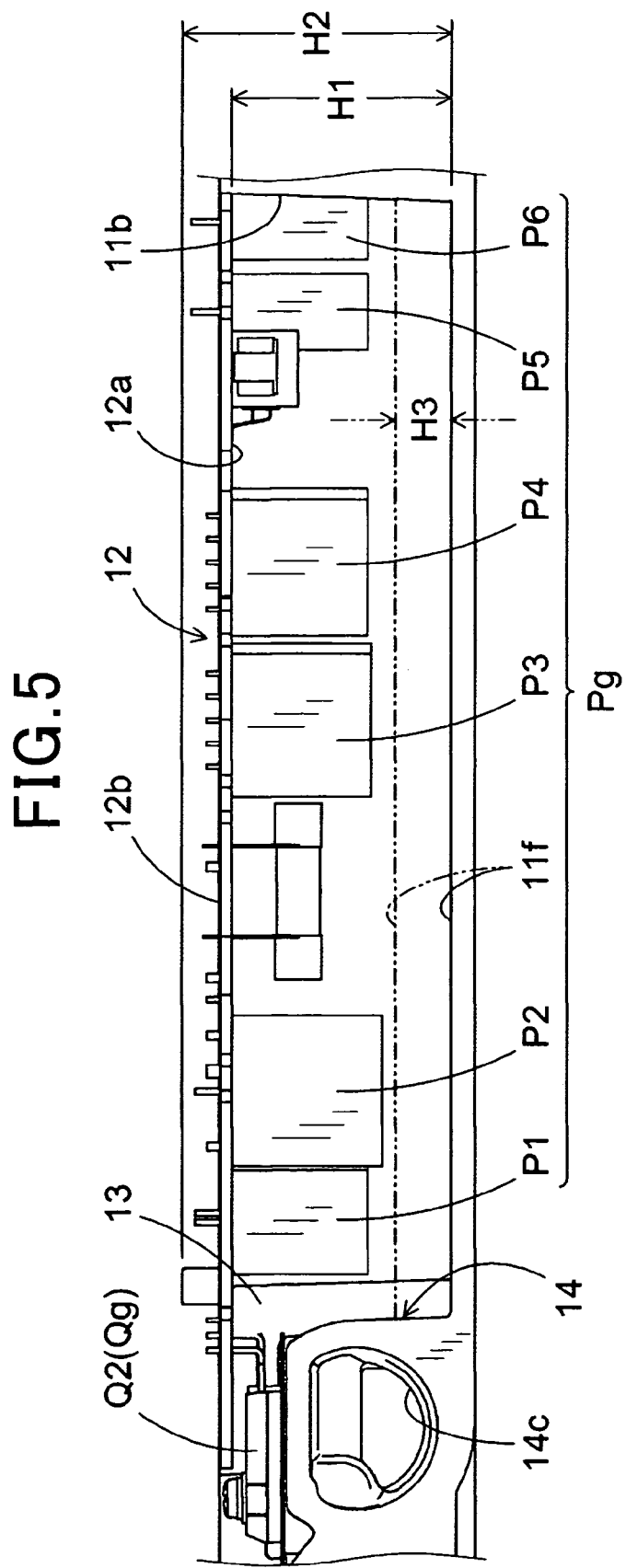
FIG. 5 is a cross-sectional view taken along a line IV-IV of FIG. 3.

FIGS. 3 and 4 show the power supply unit 10 after being accommodated with the printed circuit board 12 and the like. Specifically, FIG. 3 is a schematic plan view illustrating the power supply unit 10 not covered with the housing cover 11a. FIG. 4 is a side view illustrating the power supply unit 10 covered with the housing cover 11a as viewed from a direction of an arrow Da indicated in FIG. 3. FIG. 5 is a cross-sectional view taken along a line IV-IV of FIG. 3. As shown in FIG. 3, other than the printed circuit board 12, the interior of the housing 11 is arranged with circuit elements, such as a rectifier element 15, a transformer 16 and a filter member 17. The rectifier element 16 corresponds, for example, to a rectifier circuit or a commutator. Any filter may be used as the filter member 17 if the filter has a function of reducing or removing AC components of outputted power. Thus, any filter, whether it is passive (e.g., LC circuit, RLC circuit and RC circuit) or active may be used as the filter member 17. These circuit elements are arranged in a space (a second space (see FIG. 3)) other than a space formed between the front mounting surface 12a of the printed circuit board 12 and the bottom surface (i.e., the opposed surface) 11f of the bottom of the housing 11, which surfaces are opposed to each other (a first space (see FIG. 5)).

As shown in FIG. 4, the housing 11 of the power supply unit 10 is integrally formed with a housing 21 of a power converter 20. The power converter 20 is a so-called inverter. Since the details of such an inverter, such as its configuration and functions, are well known, illustration and description are omitted.

As shown in FIG. 5, the printed circuit board 12 is accommodated in and fixed to the housing 11. As mentioned above, the front mounting surface 12a of the printed circuit board 12 is opposed to the bottom surface 11f of the housing 11. Accordingly, the different-shape components group Pg (the different-shape components P1-P6) arranged on the printed circuit board 12 is also located opposed to the bottom surface 11f. Portions (such as partition walls and partition boards) including the bottom surface 11f correspond to the partition members. For simplicity, FIG. 5 shows only the different-shape components P1-P6. Actually, however, the printed circuit board 12 is arranged with a number of different-shape components. Further, for clarification, FIG. 5 omits hatching (the same applies to FIGS. 6 and 7 referred to later).

The cooling member 14 is formed by permitting a portion of the bottom surface 11f to project against at least the semiconductor elements group Qg (semiconductors Q1 and Q2). In the example shown in FIG. 2, a portion of the bottom surface 11f along a short side of the housing 11 (including the corners, on the left as viewed in the figure, sandwiching the short side) is permitted to project upward. The semiconductors group Qg (semiconductors Q2 in FIG. 5) is arranged (for fixation) by being directly or indirectly brought into contact with the upper surface of the cooling member 14. For example, as an example of the indirect contact, a member, such as an insulating sheet, may be interposed between the cooling member 14 and the semiconductors group Qg.

Of the different-shape components group Pg, the different-shape components P1 and P2, for example, can have a predetermined temperature or more (e.g., 85° C. or 105° C.) and thus are located near the cooling member 14. With this arrangement, the different-shape components P1 and P2, for example, are cooled by the cooling air from the cooling member 14. Accordingly, the temperatures of these different-shape components are suppressed to the heat-resistant temperature of a corresponding different-shape component. The different-shape components P1 and P2 include, for example, capacitors and common mode coils. The different-shape components P3-P6 include, for example, transformers and capacitors.

As shown in FIG. 5, the space between the front mounting surface 12a and the bottom surface 11f, which surfaces are opposed to each other, has a length (height) H1. Elements and parts, if any, to be mounted on the rear mounting surface 12b are only those elements and parts which have a small mounted height. Therefore, only a height H2 indicated in FIG. 5 is sufficient for the printed circuit board 12 to be accommodated in the housing 11. When the height H1 is substantially equal to the height Hc indicated in FIG. 1, a relation H2<Ha (see FIG. 1) is established. In this way, the size of the housing 11 is reduced compared to the conventional housing.

As shown in FIG. 5, of the different-shape components mounted on the front mounting surface 12a, the different-shape component P2 has the largest height. In order to reduce the height of the housing 11, the printed circuit board 12 may be lowered to a position at which the different-shape component P2 is located closest to the bottom face 11f. Alternatively, the bottom surface 11f may be upraised to a position indicated by the two-dot-dash line (i.e. upraised by a height H3). Thus, the height H2 is reduced to further reduce the size of the housing 11, thereby reducing dead space.

According to the first embodiment described above, the following advantages are obtained. First, in the power supply unit 10, the front mounting surface 12a as one designated surface of the printed circuit board 12 is arranged with the semiconductor elements Q1 and Q2 and the different-shape components P1-P6 having a predetermined height or more, or two types or more of the different-shape components P1-P6. Further, the cooling member 14 is formed by permitting a part of the bottom surface 11f of the housing 11 to project against at least the semiconductor elements Q1 and Q2, the bottom surface 11f being opposed to the front mounting surface 12a. Furthermore, the bottom surface 11f is insured to face two or more of the different-shape components P1-P6 arranged on the printed circuit board 12 (see FIG. 5).

With this configuration, the different-shape components P1-P6 are arranged in a space (first space) between the front mounting surface 12a and the bottom surface 11f. Thus, no elements or parts having a large height are arranged on the surface opposite to the front mounting surface 12a. As a result, the size of the housing 11 is reduced and at the same time the dead space is reduced compared to the configuration of conventional art. In spite of the reduction in the size of the housing 11, the cooling member 14 is able to directly or indirectly cool at least the semiconductor elements Q1 and Q2.

Of the two or more types of different-shape components P1-P6, the different-shape components P1 and P2, for example, whose temperature can increase to a predetermined temperature or more, are arranged near the cooling member 14 (see FIG. 5).

With this configuration, the cooling member 14 is able to cool not only the semiconductor elements Q1 and Q2 directly or indirectly, but also the different-shape components P1 and P2, for example, with the cooling air flowing from the cooling member 14. Although not shown, the different-shape components P1 and P2, for example, may be arranged being brought into direct or indirect contact with the cooling member 14. In this case, similar to the semiconductor elements Q1 and Q2, the different-shape components P1 and P2 are extremely well cooled.

The cooling member 14 is formed by permitting a portion of the bottom surface 11f along one short side (including the corners sandwiching the short side) of the housing 11 (specifically, the housing body 11b) to project upward in the housing 11 (see FIG. 5).

With this configuration, the on-board components to be arranged on the front mounting surface 12a of the printed circuit board 12 have a higher degree of freedom in the design, height and density, than forming the cooling member 14 at a portion (e.g., center of the housing 11) other than the portion along one short side of the housing 11.

Second Embodiment

Figure 6:
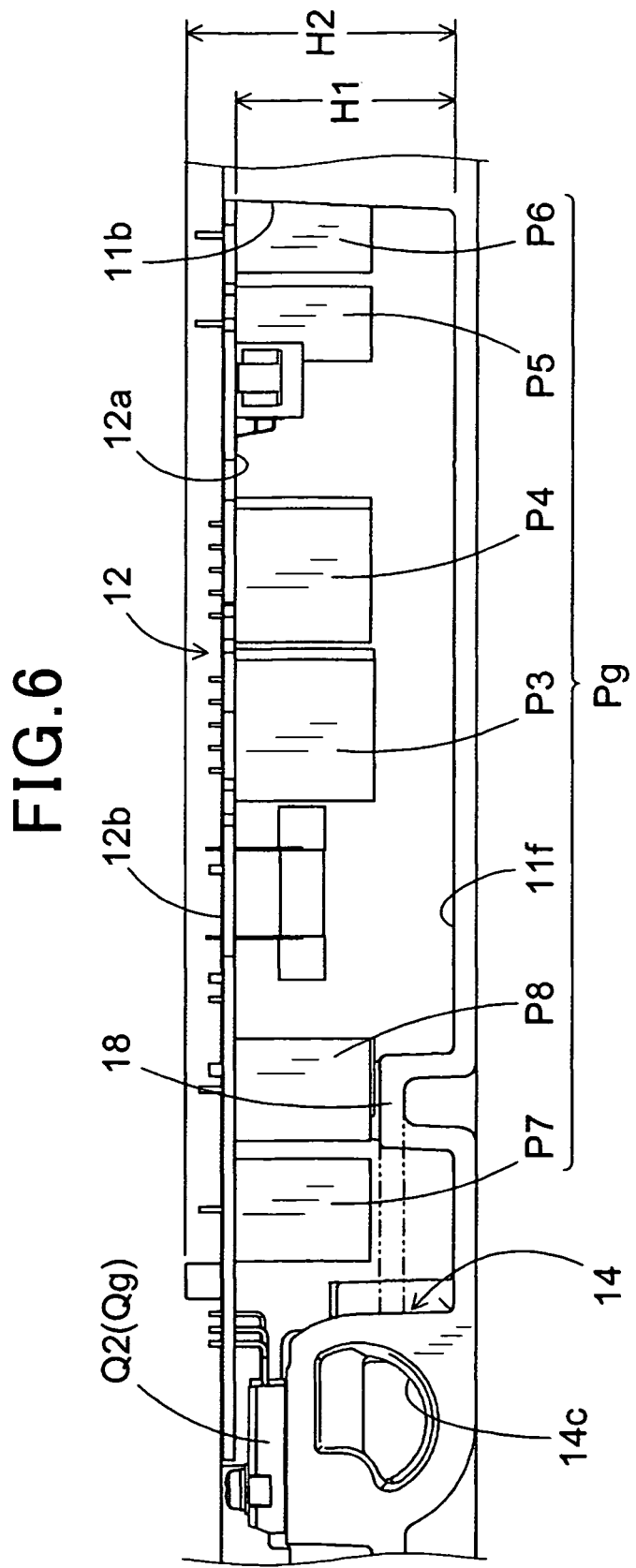
FIG. 6 is a cross-sectional view illustrating a power supply unit taken along a line V-V of FIG. 3, according to a second embodiment of the present invention.

Referring now to FIG. 6, a second embodiment that is a modification of the first embodiment is described. It should be appreciated that, in the second and the subsequent embodiments, the components identical with or similar to those in the first embodiment are given the same reference numerals for the sake of omitting unnecessary explanation.

FIG. 6 is a cross-sectional view illustrating the power supply unit 10 of the second embodiment, taken along a line V-V of FIG. 3. The second embodiment is described focusing on the differences from the first embodiment.

The second embodiment shown in FIG. 6 is different from the first embodiment in that the housing body 11b in the second embodiment is provided with a projection 18 which is projected from the bottom surface 11f toward the front mounting surface 12a. The projection 18 having a shape of a seat has a height which is of a level that an end surface thereof comes into contact with or close to a different-shape component P8. The cooling air produced by the coolant flowing through the coolant passage 14c of the cooling member 14 can cool the projection 18 via the bottom surface 11f of the housing 11, using the principle of thermal conduction. Being imparted with a cooling function of some degree, the projection 18 is able to cool the different-shape component P8.

In FIG. 6, the projection 18 is formed toward the different-shape component P8 having the largest mounted height among those of the on-board components mounted on the front mounting surface 12a. Alternative to this, the projection 18 may be formed toward another different-shape component. For example, as shown by the two-dot-dash line in FIG. 6, the projection 18 may be expanded to the cooling member 14. Thus, the projection 18 is able to cool a different-shape component P7 and other different-shape components as well, in addition to the different-shape component P8.

In the second embodiment described above, the bottom surface 11f is configured to have one or more projections 18 projected against the different-shape component 8 (see FIG. 6).

With this configuration, the cooling air produced by the coolant in the cooling member 14 can cool the projection 18 via the bottom surface 11f of the housing 11, using the principle of thermal conduction. As a result, the different-shape component P8 and the like are cooled, which are in contact with or in non-contact with (close to) the projection 18.

The above noted embodiments can provide advantages similar to those of the first embodiment. According to FIG. 6 the projection 18 can cool only the different-shape component P8. However, as a matter of course, the projection 18 may be configured to cool two or more different-shape components.

Third Embodiment

Figure 7:
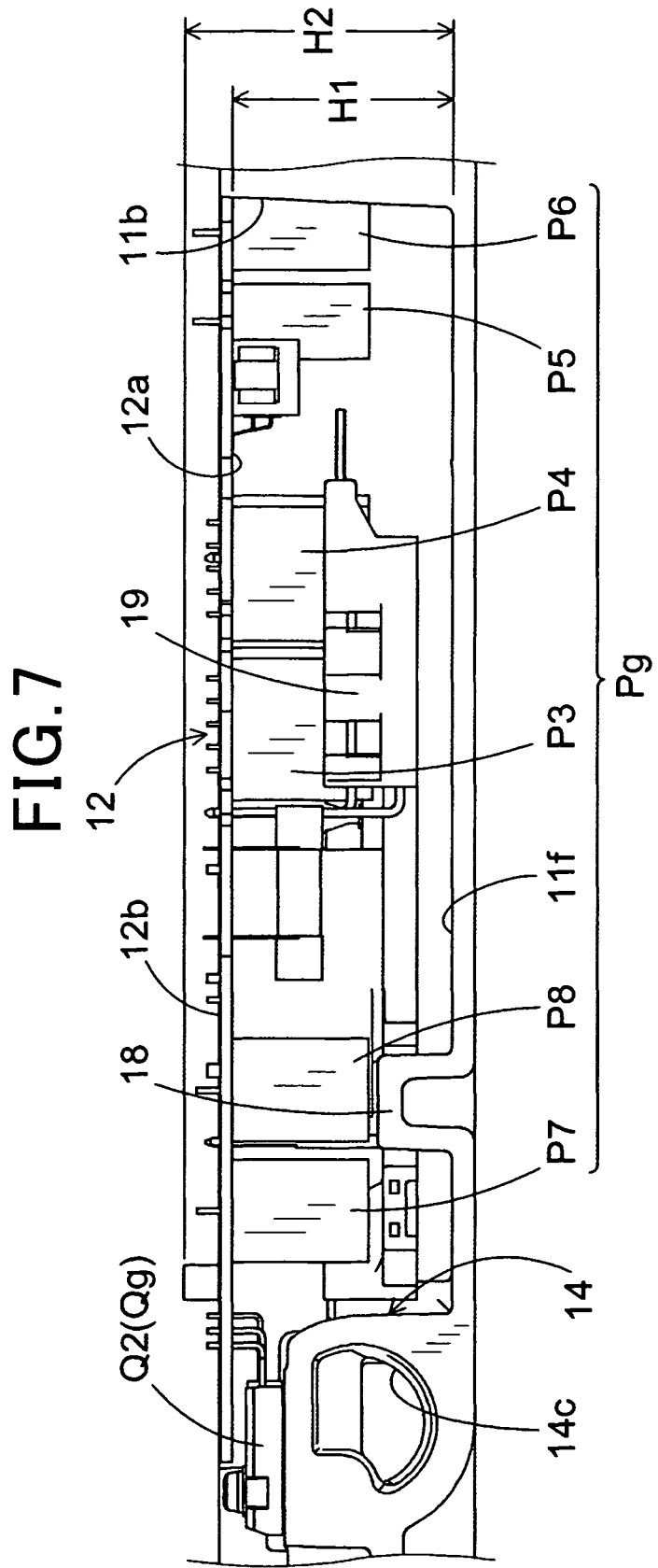
FIG. 7 is a cross-sectional view illustrating a power supply unit taken along a line V-V of FIG. 3, according to a third embodiment of the present invention.
Figure 8A:
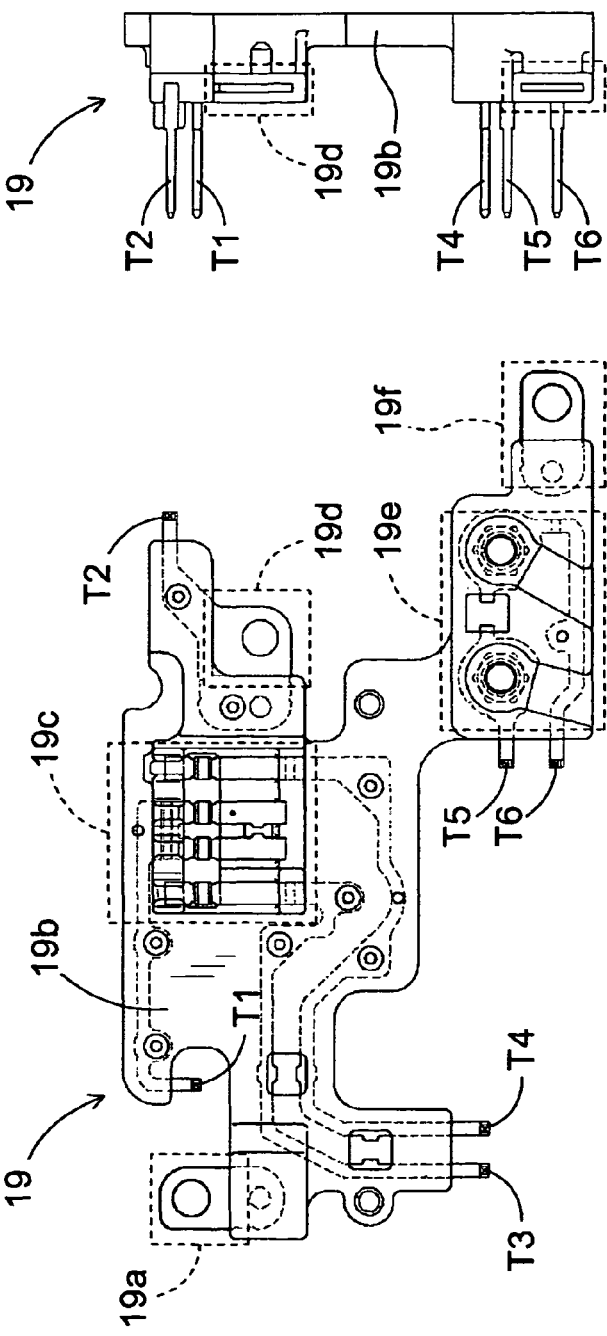
FIG. 8A is a plan view illustrating an insert bus bar according to the third embodiment.
Figure 8B:
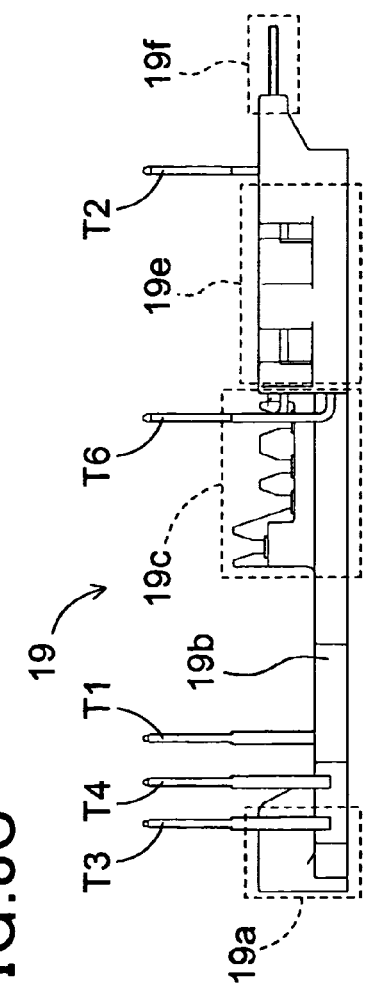
FIG. 8B is a side view illustrating the insert bus bar as viewed from the right side in FIG. 8A.
Figure 8C:
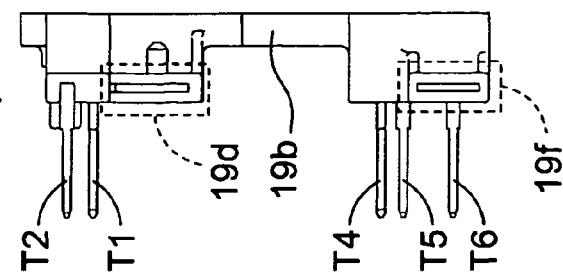
FIG. 8C is a side view illustrating the insert bus bar as viewed from the lower side in FIG. 8A.

Referring to FIG. 7 and FIGS. 8A to 8C, hereinafter is described a third embodiment of the present invention which is a modification of the first and second embodiments described above. FIG. 7 is a cross-sectional view illustrating the power supply unit 10 of the third embodiment, taken along a line V-V of FIG. 3. FIGS. 8A to 8C illustrate an insert bus bar 19 according to the third embodiment. The third embodiment is described focusing on the differences from the first and second embodiments.

The third embodiment shown in FIG. 7 is different from the second embodiment shown in FIG. 6 in that, in the third embodiment, the insert bus bar 19 is partially or entirely inserted into a gap formed between the different-shape components group Pg arranged on the front mounting surface 12a and the bottom surface 11f. The insert bus bar 19 includes terminals, a terminal block, wiring and the like and has a function of electrically connecting the circuit components with each other. It is desirable that a wire rod that can endure a high current (e.g., 10 A or 20 A) is used for a part or all of the wiring.

FIG. 8A is a plan view illustrating the insert bus bar 19. FIG. 8B is a side view illustrating the insert bus bar 19 as viewed from the right side in FIG. 8A. FIG. 8C is a side view illustrating the insert bus bar 19 as viewed from the lower side in FIG. 8A.

The insert bus bar 19 shown in FIGS. 8A to 8C includes fixing members 19a, 19d and 19f, a bus bar body 19b, a connecting terminal block 19c, an input 19e and connecting terminals T1-T6. The fixing members 19a, 19d and 19f are used for fixing the insert bus bar 19 to the printed circuit board 12 and the housing body 11b. The bus bar body 19b is provided by forming an insulating material (e.g., resin) into a given shape. Specifically, the bus bar body 19b is formed by molding, such as injection molding. The connecting terminal block 19c is arranged at a position confronting the terminals of the transformer 16 to exert a function of electrically connecting a plurality of terminals with each other. The connecting terminals T1-T6 have a function of establishing electrical connection with the printed circuit board 12 at respective predetermined positions.

According to the third embodiment described above, the following advantages are obtained. The above noted embodiments can provide advantages similar to those of the first embodiment. The above noted embodiment can provide advantages similar to those of the second embodiment.

The insert bus bar 19 is partially or entirely inserted between the front mounting surface 12a and the bottom surface 11f to establish electrical connection between the circuit elements (see FIGS. 7 and 8A-8C).

With this configuration, while the insert bus bar 19 has an electrical connection function, provision of the insert bus bar 19 does not give any difference to the height of the housing 11. This is because the space (dead space in particular) between the front mounting surface 12a and the bottom surface 11f is used for the partial or entire insertion of the insert bus bar 19. Thus, the size of the housing 11 is reduced and the dead space is more reduced compared to the configuration of conventional art.

The housing 11 includes circuit elements (i.e. the rectifier element 15, the transformer 16 and the filter member 17, see FIG. 3) that are arranged in a space (second space) other than a space (first space) formed between the front mounting surface 12a and the bottom surface 11f. Further, the insert bus bar 19 includes the connecting terminal block 19c (terminal section) (see FIGS. 3 and 7 and FIGS. 8A to 8C).

With this configuration, the connecting terminal block 19c can be arranged at a position confronting the transformer 16. This configuration can shorten the connecting distance between the connecting terminal block 19c and the transformer 16. Accordingly, the size of the housing 11 is reduced. In addition, this configuration can minimize the adverse effects of connecting wires (e.g., noise due to electrical resistance and occurrence of an electromagnetic field).

Modifications

The first to third embodiments have been described so far. However, the present invention is not limited to these embodiments. The present invention may be implemented in various modifications that fall within a scope not departing from the spirit of the present invention. For example, the present invention may be realized in the following modifications.

In the first to third embodiments described above, the housing 11 of the power supply unit 10 is integrated into the housing 21 of the power converter 20 (see FIG. 4). Alternative to this, the housing 11 may be separately configured. Alternatively, the housing 11 may be integrally formed with a housing of other devices, in place of the housing 21. The different devices include an engine block, an ECU and a vehicle body. The housing 11 may have a single space inside to cover a block member in which a plurality of spaces are defined by partition members (e.g., partition walls or partition boards). Whichever configuration may be used, the housing 11 is able to accommodate the printed circuit board 12, the cooling member 14 and the like. Accordingly, advantages similar to those of the first to third embodiments are obtained.

In the first to third embodiments described above, the printed circuit board 12 has the front mounting surface 12a and the rear mounting surface 12b (see FIGS. 2 to 7 and FIGS. 8A to 8C). Alternative to this, a multilayer circuit board may be used, which includes two or more intermediate layers. Alternatively, a universal circuit board may be used. Whichever circuit board may be used, the semiconductor elements group Qg and the different-shape components group Pg can be arranged on the board. Accordingly, the advantages similar to those of the first to third embodiments are obtained.

In the first to third embodiments described above, the cooling member 14 is projected from the bottom surface 11f toward the front mounting surface 12a, with the coolant passage 14c being formed in the projected portion to flow a coolant therethrough (see FIGS. 5 to 7). Alternative to this (or in addition to this), a different cooling means may be configured. For example, the different cooling means corresponds to one type or more selected from cooling fins (radiation fins), a heat pump, and the like. When the cooling member 14 is configured by such a different cooling means as well, the semiconductor elements group Qg and the different-shape components group Pg can be cooled. Accordingly, the advantages similar to those of the first to third embodiments are obtained.

In the first to third embodiments described above, the cooling member 14 is arranged along one short side (whether the short side may be straight or curved) of the housing body 11b (housing 11), i.e. one short side of the housing body 11b, including the corners sandwiching the short side (see FIGS. 2, 3 and 5 to 7). Alternative to this (or in addition to this), depending on structural or design constraints, the cooling member 14 may be arranged along one long side (whether the long side may be straight or curved) of the housing body 11b, including the corners sandwiching the long side.

In the first to third embodiments described above, the insert bus bar 19 is arranged in a gap formed between the different-shape components group Pg arranged on the front mounting surface 12a and the bottom surface 11f (see FIG. 7). Alternative to this (or in addition to this), a different component other than the insert bus bar 19 may be arranged in the gap. The different component may be another bus bar or a fan. Since the different component and/or the insert bus bar 19 can be arranged using the gap, the dead space is further reduced. It should be appreciated that the fan may desirably be arranged near the cooling member 14. Using the fan arranged in this way, the air sealed in the housing 11 is circulated or diffused to efficiently cool the entire interior of the housing 11.

The present invention may be embodied in several other forms without departing from the spirit thereof. The embodiments and modifications described so far are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A power supply unit comprising:
a printed circuit board on which two or more different-shape components having mutually-different heights provided when the components are mounted on the printed circuit board, wherein at least some of the different-shape components respectively include semiconductor devices, the different-shape components are two or more types of the different-shape components wherein the two or more types of the different-shape components include specific different-shape components whose temperatures rise over a predetermined temperature when being operated, the printed circuit board has two or more mounting surfaces including a single designated mounting surface, and the semiconductor devices and the different-shape components are mounted on the designated mounting surface;
a housing that houses the printed circuit board and comprises a cooling member for cooling a first space, formed in the housing, between the designated mounting surface of the printed circuit board and an opposed surface of the housing, wherein the opposed surface is opposed to the designated mounting surface, the cooling member is arranged at a part of the opposed surface, the part of the opposed surface projects toward the semiconductor devices, and the opposed surface is opposed to the two or more types of the different-shape components; and
insert bus bars which are partly or entirely arranged between the designated mounting surface and the opposed surface to electrical connect circuit components on the designated mounting surface, the circuit components including the semiconductor devices, wherein:
the specific different-shape components are located to directly or indirectly be in touch with the cooling member or located near the cooling member, and
the opposed surface has one or more projections projecting toward the different-shape components.

2. The power supply unit of claim 1, wherein the housing has a second space other than the first space formed between the designated mounting surface and the opposed surface, the circuit components including circuit elements located in the second space, and
the insert bus bars include terminal sections for electrical connection with the circuit elements.

3. The power supply unit of claim 2, wherein the projected part of the opposed surface is located at an end portion of the opposed surface.

4. The power supply unit of claim 2, wherein the cooling member includes a cooling medium and is arranged under the projected part of the opposed surface and the opposed surface is a surface of a wall of the housing.

5. The power supply unit of claim 4, the projected part of the opposed surface is located at an end portion of the opposed surface, the end portion being opposed to the semiconductor devices.

6. The power supply unit of claim 1, a wall of the housing is a bottom of the housing, the bottom is made of a heat conductive material, the bottom is produced from a single plate having the projected part and the one or more projections.

7. The power supply unit of claim 1, wherein the cooling member includes a cooling medium and is arranged under the projected part of the opposed surface and the opposed surface is a surface of a wall of the housing.

8. The power supply unit of claim 7, the projected part of the opposed surface is located at an end portion of the opposed surface, the end portion being opposed to the semiconductor devices.

9. A power supply unit comprising:
a printed circuit board on which two or more different-shape components having mutually-different heights provided when the components are mounted on the printed circuit board, wherein at least some of the different-shape components respectively include semiconductor devices, the different-shape components are either the different-shape components having at least a predetermined height when being mounted on the printed circuit board or two or more types of the different-shape components, the printed circuit board has two or more mounting surfaces including a single designated mounting surface, and the semiconductor devices and the different-shape components are mounted on the designated mounting surface;
a housing that houses the printed circuit board and comprises a cooling member for cooling a first space, formed in the housing, between the designated mounting surface of the printed circuit board and an opposed surface of the housing, wherein the opposed surface is opposed to the designated mounting surface, the cooling member is arranged at a part of the opposed surface, the part of the opposed surface projects toward the semiconductor devices, and the opposed surface is opposed to the two or more different-shape components; and
insert bus bars which are partly or entirely arranged between the designated mounting surface and the opposed surface to electrical connect circuit components on the designated mounting surface, the circuit components including the semiconductor devices.

10. The power supply unit of claim 9, wherein the housing has a second space other than the first space formed between the designated mounting surface and the opposed surface, the circuit components including circuit elements located in the second space, and
the insert bus bars include terminal sections for electrical connection with the circuit elements.

11. The power supply unit of claim 10, wherein the projected part of the opposed surface is located at an end portion of the opposed surface.

12. A power supply unit comprising:
a printed circuit board on which two or more different-shape components having mutually-different heights provided when the components are mounted on the printed circuit board, wherein at least some of the different-shape components respectively include semiconductor devices, the different-shape components are two or more types of the different-shape components wherein the two or more types of the different-shape components include specific different-shape components whose temperatures rise over a predetermined temperature when being operated, the printed circuit board has two or more mounting surfaces including a single designated mounting surface, and the semiconductor devices and the different-shape components are mounted on the designated mounting surface;
a housing that houses the printed circuit board and comprises a cooling member for cooling a first space, formed in the housing, between the designated mounting surface of the printed circuit board and an opposed surface of the housing, wherein the opposed surface is opposed to the designated mounting surface, the cooling member is arranged at a part of the opposed surface, the part of the opposed surface projects toward the semiconductor devices, and the opposed surface is opposed to the two or more types of the different-shape components; and
insert bus bars which are partly or entirely arranged between the designated mounting surface and the opposed surface to electrical connect circuit components on the designated mounting surface, the circuit components so including the semiconductor devices,
wherein the specific different-shape components are located to directly or indirectly be in touch with the cooling member or located near the cooling member.

13. The power supply unit of claim 12, wherein the housing has a second space other than the first space formed between the designated mounting surface and the opposed surface, the circuit components including circuit elements located in the second space, and the insert bus bars include terminal sections for electrical connection with the circuit elements.

14. The power supply unit of claim 13, wherein the projected part of the opposed surface is located at an end portion of the opposed surface.

15. The power supply unit of claim 12, wherein the projected part of the opposed surface is located at an end portion of the opposed surface.

* * * * *